United States Patent [19]
Kagawa

[11] Patent Number: 5,734,295
[45] Date of Patent: Mar. 31, 1998

[54] QUADRATURE DEMODULATOR HAVING ACTIVE FILTERS FORMED WITH EMITTER FOLLOWER OUTPUT STAGES

[75] Inventor: Shigeru Kagawa, Tokyo, Japan

[73] Assignee: NEC Corporation, Tokyo, Japan

[21] Appl. No.: 749,402

[22] Filed: Nov. 15, 1996

[30] Foreign Application Priority Data

Nov. 17, 1995 [JP] Japan ................................ 7-323630

[51] Int. Cl.$^6$ ............................. H03D 1/22; H03D 7/16
[52] U.S. Cl. ................. 329/305; 329/306; 329/318; 329/323; 375/324; 455/214; 455/312; 455/337
[58] Field of Search ....................... 329/323, 308, 329/318, 325, 326, 305, 306; 455/214, 312, 337; 375/324

[56] References Cited

U.S. PATENT DOCUMENTS 5,140,198   8/1992   Atherly et al. ........................ 455/302

FOREIGN PATENT DOCUMENTS

| 0 322 157 | 6/1989 | European Pat. Off. . |
| 0 059 000 | 9/1992 | European Pat. Off. . |
| WO 91/03882 | 3/1991 | WIPO . |

OTHER PUBLICATIONS

Malikov, et al. "A Linear Synchronous Detector," 1298 Telecommunication and radio engineering, vol. 35/36, No. 1, Jan. 1981, pp. 63–66.

Chapovskiy, et "Q-Factor Instability of the Complex Conjugate Poles of an Emmitter-Follower Active RC-Network," 1298 Telecommunications and radio engineering, Vo. 24, No. 10, Oct. 1969, pp. 139–140.

*Primary Examiner*—Siegfried H. Grimm
*Attorney, Agent, or Firm*—Foley & Lardner

[57] ABSTRACT

The invention provides a quadrature demodulator which removes unnecessary higher harmonic signals included in a demodulation output without giving rise to increase in number of externally connected parts and increase in current consumption. The quadrature demodulator includes a first double differential circuit to which a modulated signal and a first local signal are inputted, a first emitter follower circuit for effecting impedance conversion, a second double differential circuit to which the modulated signal and a second local signal having a phase shifted by 90-degrees from the first local signal are inputted, and a second emitter follower circuit connected to a pair of outputs of the second double differential circuit for effecting impedance conversion. The quadrature demodulator further includes a CR circuit including a resistor and a capacitor connected to each of the outputs of the first and second double differential circuits such that an active filter is formed from the CR circuit and a corresponding one of the first and second emitter follower circuits.

3 Claims, 3 Drawing Sheets

QUADRATURE DEMODULATOR HAVING ACTIVE FILTERS FORMED WITH EMITTER FOLLOWER OUTPUT STAGES

BACKGROUND OF THE INVENTION

1. Field of the Invention

This invention relates to a quadrature demodulator, and more particularly to a quadrature demodulator which removes higher harmonic components included in a demodulation output obtained by demodulation of a modulated signal with a local signal and a 90-degree phase shifted local signal.

2. Description of the Related Art

A conventional quadrature demodulator typically has such a construction as shown in FIG. 3. Referring to FIG. 3, the conventional quadrature demodulator shown includes a first double differential circuit to which a local signal is inputted via a pair of terminals 16 and a modulated signal is inputted via another pair of terminals 17 and which includes transistors 1 to 6, resistors 9 to 12 and a constant current source 13, a first emitter follower circuit including a pair of transistors 7 and 8 to which a pair of outputs of the first double differential circuit are inputted and a pair of constant current sources 14 and 15 connected to the emitters of the transistors 7 and 8, respectively, a second double differential circuit to which a 90-degree phase shifted local signal is inputted via a further pair of terminals 35 and the modulated signal is inputted via the terminals 17 and which includes transistors 20 to 25, resistors 28 to 31 and a constant current source 32, and a second emitter follower circuit including a pair of transistors 26 and 27 to whose bases a pair of outputs of the second double differential circuit are inputted and a pair of constant current sources 33 and 34 connected to the emitters of the transistors 26 and 27, respectively. In the first double differential circuit, the first differential pair transistors 1 and 2 and the second differential pair transistors 3 and 4 receive a differential local signal with the collectors thereof connected in cross connection, and the third differential pair transistors 5 and 6 have the resistors 11 and 12 connected thereto, and receive and convert a differential modulated signal voltage into a differential current and supply output difference currents to the first and second differential pair transistors 1, 2 and 3, 4, respectively. A pair of outputs of the first double differential circuit is extracted from junctions between the collectors of the first and second differential pair transistors 1, 2 and 3, 4 and load resistor elements 9 and 10. Also the second double differential circuit is constructed in a similar manner.

Operation of the conventional quadrature demodulator will be described below.

A modulated signal inputted to the terminals 17 is modulated with a local signal inputted to the terminals 16 by the first double differential circuit and converted into a low impedance signal by the first emitter follower circuit and then extracted as an in-phase demodulation signal from a pair of output terminals 19.

Further, the modulated signal inputted to the terminals 17 is demodulated with a 90-degree phase shifted local signal inputted to the terminals 35 by the second double differential circuit, converted into a low impedance signal by the second emitter follower circuit and extracted as a 90-degree phase shifted demodulation signal from another pair of output terminals 37.

However, since a rectangular wave signal is usually used for the local signal inputted to the terminals 16 and the 90-degree phase shifted local signal inputted to the terminals 35, in addition to a desired in-phase demodulation signal and a 90-degree phase shifted demodulation signal, higher harmonic signals which are sums or differences between higher harmonics of the local signal and the 90-degree phase shifted local signal and the modulated signal are outputted from the output terminals 19 and 37.

In order to eliminate such unnecessary higher harmonic signals, active filters (not shown) are connected at the next stages to the output terminals 19 and 37.

As described above, in the conventional quadrature demodulator shown in FIG. 3, it is required to connect active filters at the next stages to the quadrature demodulator in order to remove unnecessary higher harmonic signals included in a demodulated output signal. Accordingly, the conventional quadrature demodulator is disadvantageous in that, when it is implemented as an integrated circuit (IC), the connection of such active filters results in increase in number of externally connected parts and increase in current consumption.

SUMMARY OF THE INVENTION

It is an object of the present invention to provide a quadrature demodulator which removes unnecessary higher harmonic signals included in a demodulation output of the quadrature demodulator without giving rise to increase in number of externally connected parts and increase in current consumption.

In order to attain the object described above, according to the present invention, there is provided a quadrature demodulator, comprising a first double differential circuit to which a modulated signal and a first local signal are inputted, a first emitter follower circuit connected to a pair of outputs of the first double differential circuit for effecting impedance conversion of signals inputted thereto from the first double differential circuit, a second double differential circuit to which the modulated signal and a second local signal having a phase shifted by 90 degrees from the first local signal are inputted, a second emitter follower circuit connected to a pair of outputs of the second double differential circuit for effecting impedance conversion of signals inputted thereto from the second double differential circuit, and a CR circuit including a resistor and a capacitor connected to each of the outputs of the first and second double differential circuits such that an active filter is formed from the CR circuit and a corresponding one of the first and second emitter follower circuits.

In short, the quadrature demodulator of the present invention is characterized in that it includes emitter follower circuits for effecting low impedance conversion for demodulated outputs of double differential circuits, and active filters each formed from a resistor (R) and a capacitor (C). The circuit (network) formed from a resistor (R) and a capacitor (C) is referred to as a CR circuit herein.

With the quadrature demodulator, the demodulation outputs thereof do not include unnecessary higher harmonic signals, and consequently, there is no need of connecting active filters at the next stage to the quadrature demodulator. Consequently, the number of parts to be attached as external parts when the quadrature demodulator is implemented as an IC can be reduced, and accordingly, the power dissipation can be reduced.

Preferably, the quadrature demodulator is constructed such that a transistor which forms each of the first and second emitter follower circuits for impedance conversion is used commonly as a transistor which forms the active filter.

and cooperates with the CR circuit to form a low-pass filter having a desired frequency characteristic. This eliminates the necessity for disposition of the active filters as externally attached parts. Consequently, the number of parts is reduced to reduce the power dissipation while an increase in number of elements built in the quadrature demodulator is suppressed.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENT

Figure 1:
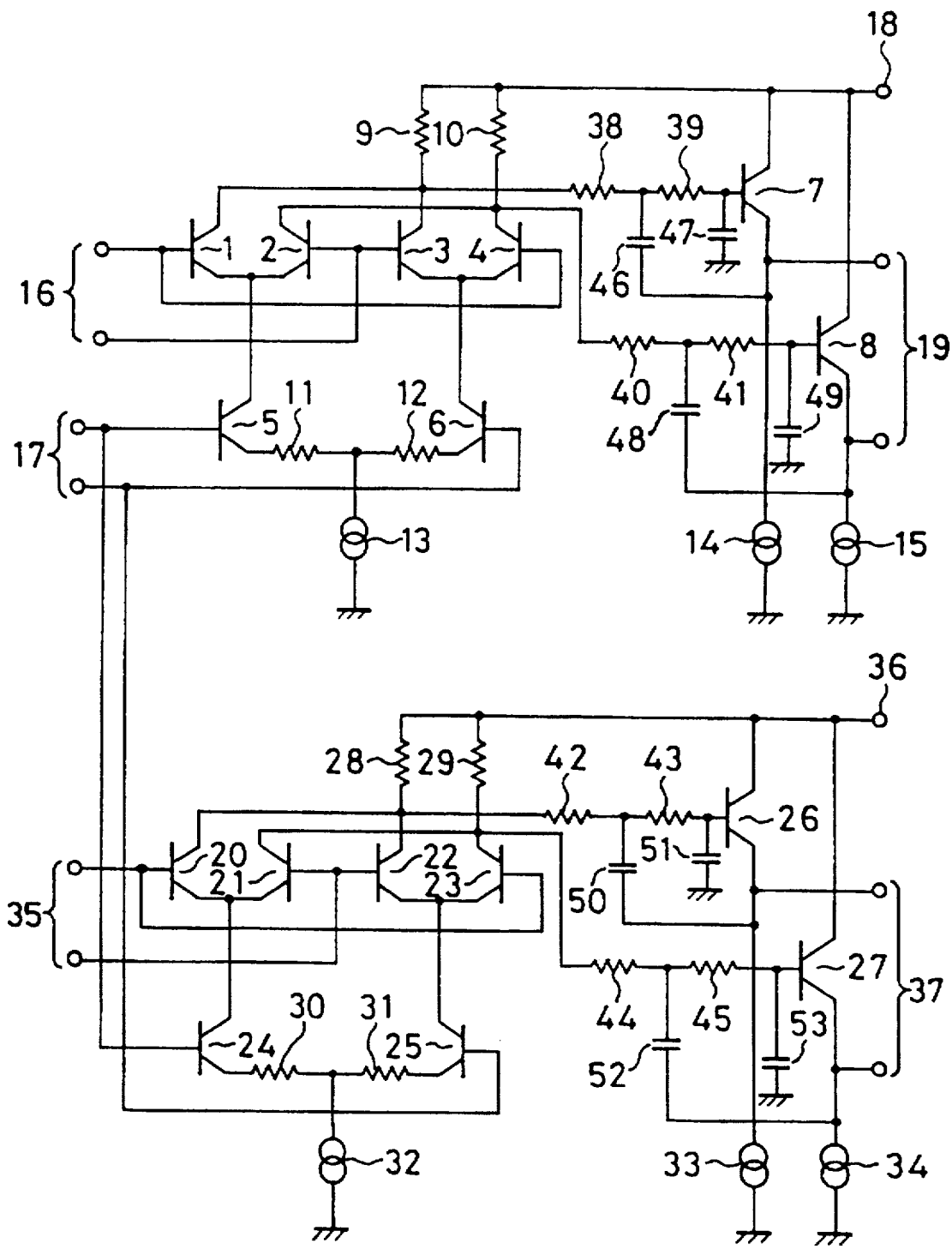
FIG. 1 is a circuit diagram of a quadrature demodulator showing a preferred embodiment of the present invention.

Referring first to FIG. 1, there is shown in circuit diagram a circuit construction of a quadrature demodulator to which the present invention is applied. The quadrature demodulator is an improvement to and includes common elements to those of the conventional quadrature demodulator described hereinabove with reference to FIG. 3. In particular, the quadrature demodulator includes first and second double differential circuits for inputting a local signal, a 90-degree phase shifted local signal and a modulated signal, which have similar constructions to those of the conventional quadrature demodulator, and overlapping description of the common construction is omitted herein to redundancy, but only differences of the quadrature demodulator from the conventional quadrature demodulator will be described below. It is to be noted that, in FIG. 1, like or corresponding elements to those of the conventional quadrature demodulator are denoted by like reference numerals to those of FIG. 3.

Figure 3:
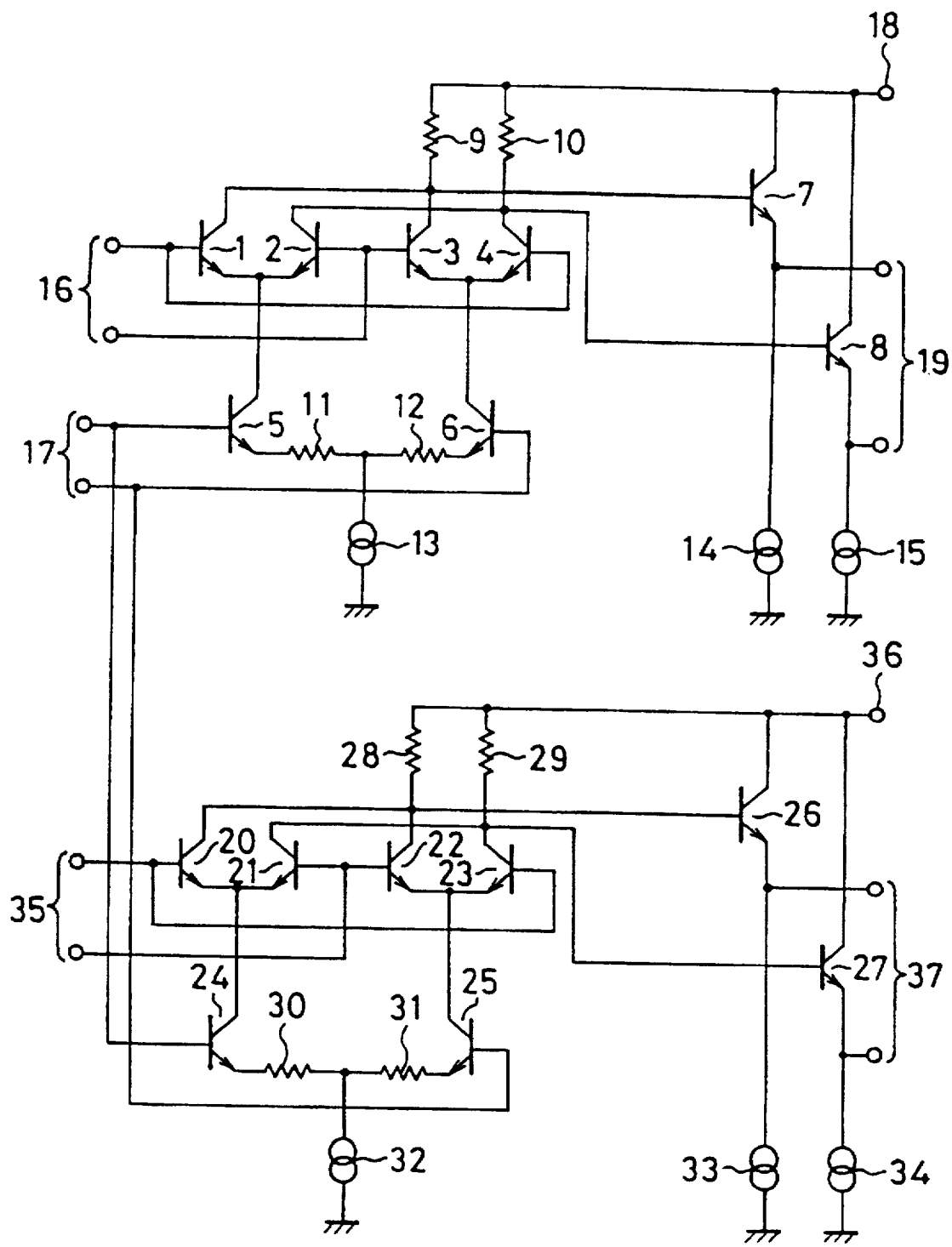
FIG. 3 is a circuit diagram showing a circuit construction of a conventional quadrature modulator.

The quadrature demodulator shown in FIG. 1 is different in construction from the conventional quadrature demodulator shown in FIG. 3 in that the first emitter follower circuit additionally includes resistors 38 to 41 and capacitors 46 to 49 and the second emitter follower circuit additionally includes resistors 42 to 45 and capacitors 50 to 53.

An in-phase demodulation signal demodulated by the first double differential circuit and including unnecessary higher harmonic signals is inputted to a second-order active low-pass filter formed from the resistors 38 to 41, capacitors 46 to 49 and transistors 7 and 8. The unnecessary higher harmonic signals are removed from the in-phase demodulation signal by the second-order active low-pass filter, and a resulting signal from the second-order active low-pass filter is outputted to the output terminals 19.

Meanwhile, a 90-degree phase shifted demodulation signal demodulated by the second double differential circuit and including unnecessary higher harmonic signals is inputted to another second-order active low-pass filter formed from the resistors 42 to 45, capacitors 50 to 53 and transistors 26 and 27. The unnecessary higher harmonic signals are removed from the 90-degree phase shifted modulation signal by the second-order active low-pass filter, and a resulting signal from the second-order active low-pass filter is outputted to the output terminals 37.

Accordingly, a desired in-phase demodulation output and a 90-degree phase shifted demodulation output which do not include unnecessary higher harmonic signals are obtained from the output terminals 19 and 37, respectively.

Figure 2:
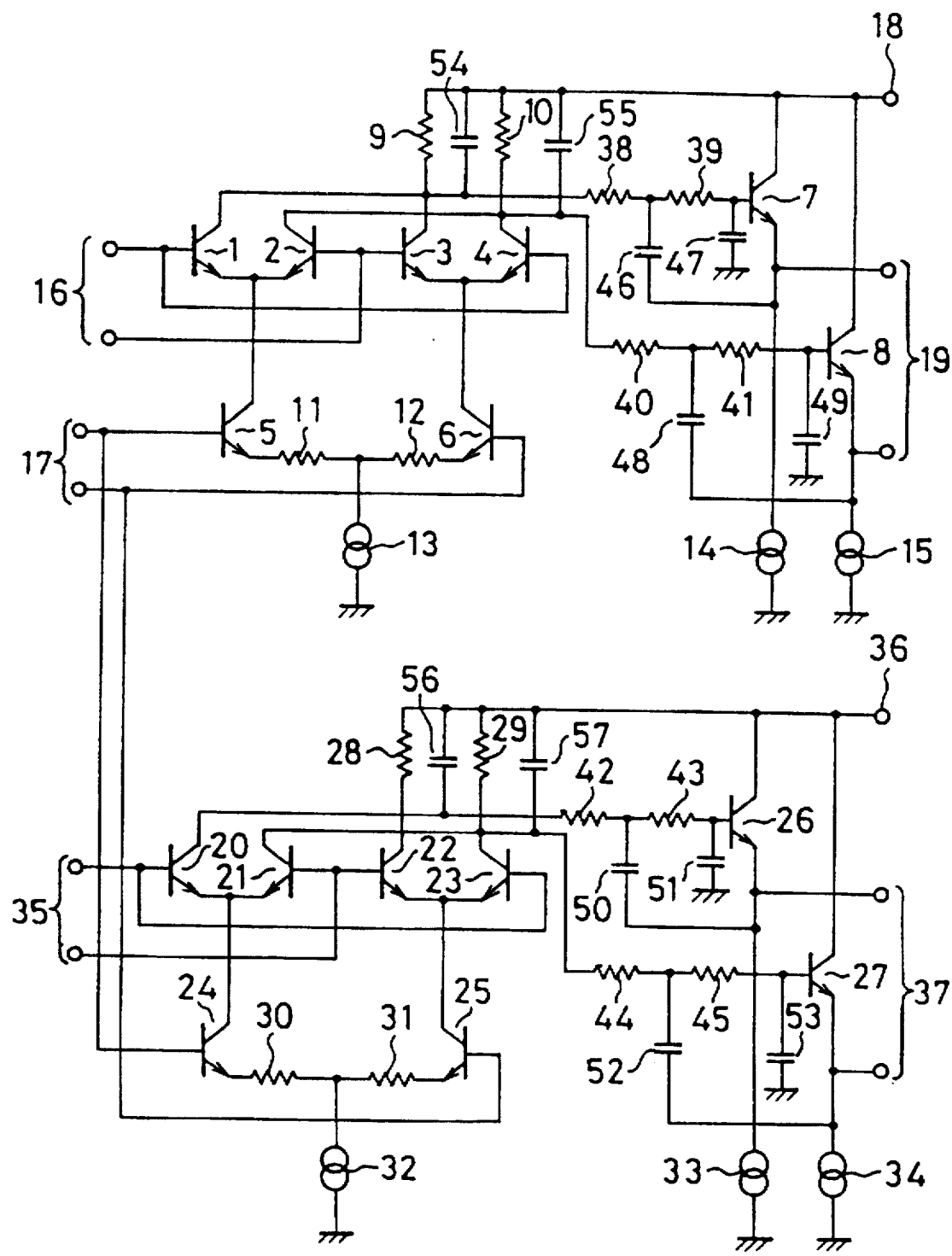
FIG. 2 is a similar view but showing a modification to the quadrature demodulator of FIG. 1.

FIG. 2 shows a circuit construction of a modification to the quadrature demodulator of the embodiment described above with reference to FIG. 1. The modified quadrature demodulator is different from the quadrature demodulator of the embodiment of FIG. 1 in that capacitors 54 and 55 are interposed between a power supply 18 and the outputs of the first double differential circuit while capacitors 56 and 57 are interposed between another power supply 36 and the outputs of the second double differential circuit. In the modified quadrature demodulator, since the capacitors 54 to 57 are provided additionally, the number of orders of active low-pass filters of the first and second double differential circuits is increased to 3, and consequently, unnecessary higher harmonics can be attenuated by a greater degree than those in the quadrature demodulator of the embodiment to FIG. 1.

Having now fully described the invention, it will be apparent to one of ordinary skill in the art that many changes and modifications can be made thereto without departing from the spirit and scope of the invention as set forth herein.

What is claimed is:

1. A quadrature demodulator, comprising:
    a first double differential circuit to which a modulated signal and a first local signal are inputted;
    a first emitter follower circuit connected to a pair of outputs of said first double differential circuit for effecting impedance conversion of signals inputted thereto from said first double differential circuit;
    a second double differential circuit to which the modulated signal and a second local signal having a phase shifted by 90 degrees from the first local signal are inputted;
    a second emitter follower circuit connected to a pair of outputs of said second double differential circuit for effecting impedance conversion of signals inputted thereto from said second double differential circuit; and
    a CR circuit including a resistor and a capacitor connected to each of the outputs of said first and second double differential circuits such that an active filter is formed from said CR circuit and a corresponding one of said first and second emitter follower circuits.

2. A quadrature demodulator as claimed in claim 1, wherein a transistor which forms each of said first and second emitter follower circuits is used commonly as a transistor which forms said active filter, and cooperates with said CR circuit to form a low-pass filter having a desired Frequency characteristic.

3. A quadrature demodulator as claimed in claim 2, wherein a capacitor is interposed between a power supply and each of the outputs of said first and second double differential circuits so as to form a low-pass active filter having an order number of at least three.

* * * * *